United States Patent
Walker et al.

(10) Patent No.: US 7,023,366 B1
(45) Date of Patent: Apr. 4, 2006

(54) USING A PARAMETRIC MEASUREMENT UNIT FOR CONVERTER TESTING

(75) Inventors: Ernest Walker, Weston, MA (US); Ronald A. Sartschev, Dunstable, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/137,240

(22) Filed: May 25, 2005

Related U.S. Application Data

(60) Provisional application No. 60/639,150, filed on Dec. 23, 2004.

(51) Int. Cl.
*H03M 1/10* (2006.01)
(52) U.S. Cl. .......................... 341/120; 341/118
(58) Field of Classification Search ............... 341/118, 341/120, 144; 324/73 R, 73.1, 158.1, 537, 324/761, 763, 765
See application file for complete search history.

(56) References Cited

U.S. PATENT DOCUMENTS

| | | | | |
|---|---|---|---|---|
| 4,888,548 A | * | 12/1989 | Chism | ........................ 324/73.1 |
| 5,566,088 A | * | 10/1996 | Herscher et al. | ............. 702/123 |
| 6,195,772 B1 | * | 2/2001 | Mielke et al. | ............... 714/724 |
| 6,768,349 B1 | * | 7/2004 | Nakagawa | ................... 327/100 |
| 6,940,271 B1 | * | 9/2005 | West | ....................... 324/158.1 |
| 2002/0171449 A1 | * | 11/2002 | Shimizu et al. | ............. 324/765 |
| 2003/0030446 A1 | * | 2/2003 | Wang et al. | ................ 324/525 |
| 2004/0246002 A1 | * | 12/2004 | Roberts et al. | ............. 324/537 |

\* cited by examiner

*Primary Examiner*—Linh V. Nguyen

(57) ABSTRACT

In one aspect, the invention is an integrated circuit (IC) for use in testing an analog-to-digital (ADC) converter includes a first channel of a parametric measurement unit (PMU) configured to send a force signal to the ADC. The IC also includes a first digital-to-analog converter (DAC) connected to the first channel of the PMU. The DAC has a DC level of accuracy of less than 1 millivolt.

In another aspect, the invention is an integrated circuit (IC) for use in testing a digital-to-analog-converter-device-under-test (DACDUT). The IC includes a first channel of a parametric measurement unit (PMU) configured to send a force signal to the DACDUT and including an output port for taking measurements, a first digital-to-analog converter (DAC) connected to the first channel of the PMU and a PMU measurement path connected to the output port having a DC level of accuracy of less than 1 mV.

8 Claims, 3 Drawing Sheets

USING A PARAMETRIC MEASUREMENT UNIT FOR CONVERTER TESTING

RELATED APPLICATIONS

This application claims priority to Provisional Application No. 60/639,150, filed Dec. 23, 2004, titled "USING A PARAMETRIC MEASUREMENT UNIT FOR CONVERTER TESTING" and is incorporated herein in its entirety.

TECHNICAL FIELD

This patent application relates generally to testing a device and, more particularly, to testing converters using a parametric measurement unit (PMU).

BACKGROUND

Automatic test equipment (ATE) refers to an automated, usually computer-driven, approach to testing devices, such as semiconductors, electronic circuits, and printed circuit board assemblies, for example. A parametric measurement unit (PMU) is typically part of an ATE. A PMU is used during device testing to measure parameters, such as voltage and current, at a device pin, and to regulate those parameters. The PMU attempts to ensure that, during testing, proper parameter values are applied to the device-under-test (DUT). A PMU typically includes circuitry for forcing a voltage and/or current to the DUT.

SUMMARY

Converter testing is a feature for testing of analog-to-digital converters (ADC) and digit-to-analog converters (DAC) by allowing accurate voltages from separate DACs measured at a high repetition rate. This function has traditionally been implemented on separate instrument boards. However, by adding an accurate DAC inside a PMU circuitry, the PMU circuitry may be used for converter testing of an ADC. By adding accurate measurement paths, the PMU circuitry may be used for testing of a DAC.

In one aspect, the invention is an integrated circuit (IC) for use in testing an analog-to-digital (ADC) converter. The IC includes a first channel of a parametric measurement unit (PMU) configured to send a force signal to the ADC and a first digital-to-analog converter (DAC) connected to the first channel of the PMU. The DAC has a DC level of accuracy of less than 1 millivolt.

In another aspect, the invention is an integrated circuit (IC) for use in testing a digital-to-analog-converter-device-under-test (DACDUT). The IC includes a first channel of a parametric measurement unit (PMU) configured to send a force signal to the DACDUT and including an output port for taking measurements, a first digital-to-analog converter (DAC) connected to the first channel of the PMU, and a PMU measurement path connected to the output port having a DC level of accuracy of less than 1 mV.

The aspects above may include one or more of the following features. The IC may include a second channel of the PMU receiving a sense signal from the DUT and providing a first sensing path to the first channel of the PMU. The IC may include a third channel of PMU configured to send a reference force signal and a second digital-to-analog converter (DAC) connected to the third channel of the PMU. The IC may include a fourth channel of the PMU receiving a reference sense signal and providing a second sensing path to the third channel of the PMU. The IC may include a force line connected to the first channel of the PMU supplying the force signal and having a DC level of accuracy of less than 1 mV.

The PMU circuitry described herein provides a converter testing functionality within the same the IC as the PMU and thus provides an alternative way of testing converters. The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
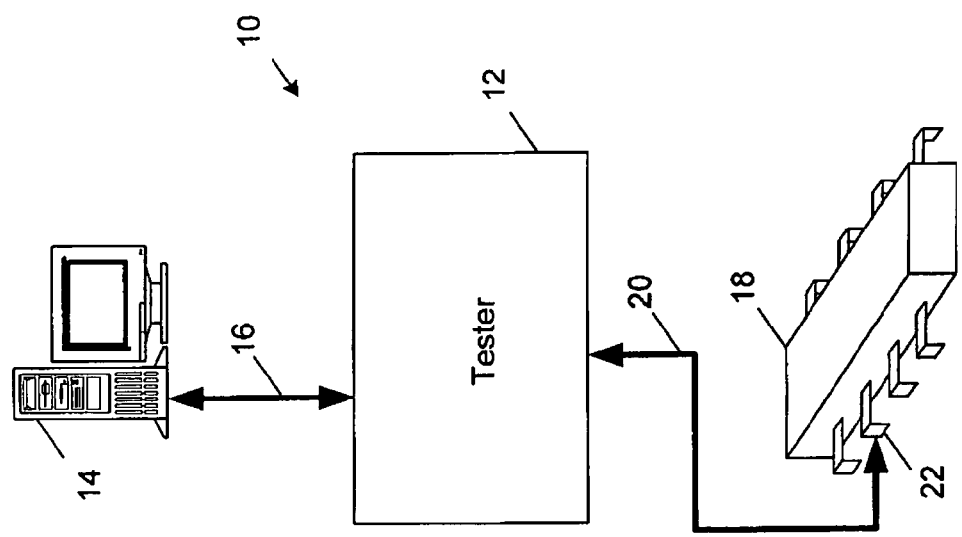
FIG. 1 is a diagrammatic view of a system for testing devices.

Referring to FIG. 1, a system 10 for testing a device-under-test (DUT) 18 such as semiconductor devices includes a tester 12 such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collecting responses from the DUT. Various types of DUTs may be tested by system 10. For example, DUTs may be semiconductor devices such as an integrated circuit (IC) chip (e.g., analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example semiconductor device tester 12 is connected to one connector pin of DUT 18 by a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized along with other single port testing quantities. In other test scenarios a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine such quantities as gain response, phase response, and other throughput measurement quantities.

Figure 2:
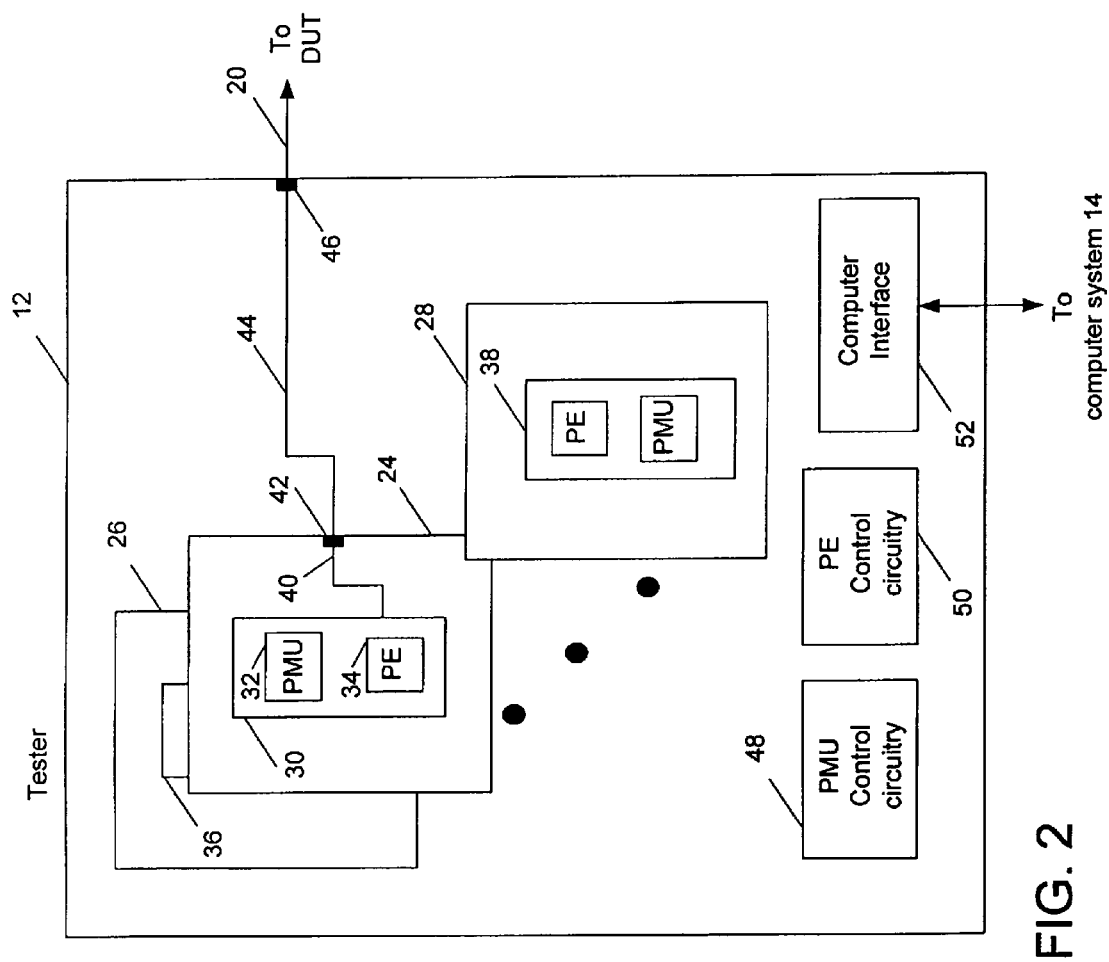
FIG. 2 is a diagrammatic view of a tester.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect the corresponding responses. Each communication link to a pin is typically referred to as a channel and by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and Pin electronics (PE) tests. IC chip 30 respectively has a PMU stage 32 that includes circuitry for performing PMU tests and a PE stage 34 that includes circuitry for performing PE tests. Additionally interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit (to the DUT) AC test signals that represent a vector of binary values for storing on the DUT. Once stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46 that allows signals to be passed to and from tester 12. In this example conductor 20 is connected to interface connector 46 for bi-directional signal passing between tester 12 and pin 22 of DUT 18. In some arrangements an interface device may be used to connect one or more conductors from tester 12 to the DUT. For example, the DUT (e.g., DUT 18) may be mounted onto a device interface board (DIB) for providing easy access to each DUT pin. In such an arrangement, conductor 20 may be connected to the DIB for placing test signals on the appropriate pin(s) (e.g., pin 22) of the DUT.

In this example only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. Tester 12 also includes a computer interface 52 that allows computer system 14 to control the operations executed by tester 12 and also allows data (e.g., test parameters, DUT responses, etc.) passing between tester 12 and computer system 14.

Figure 3:
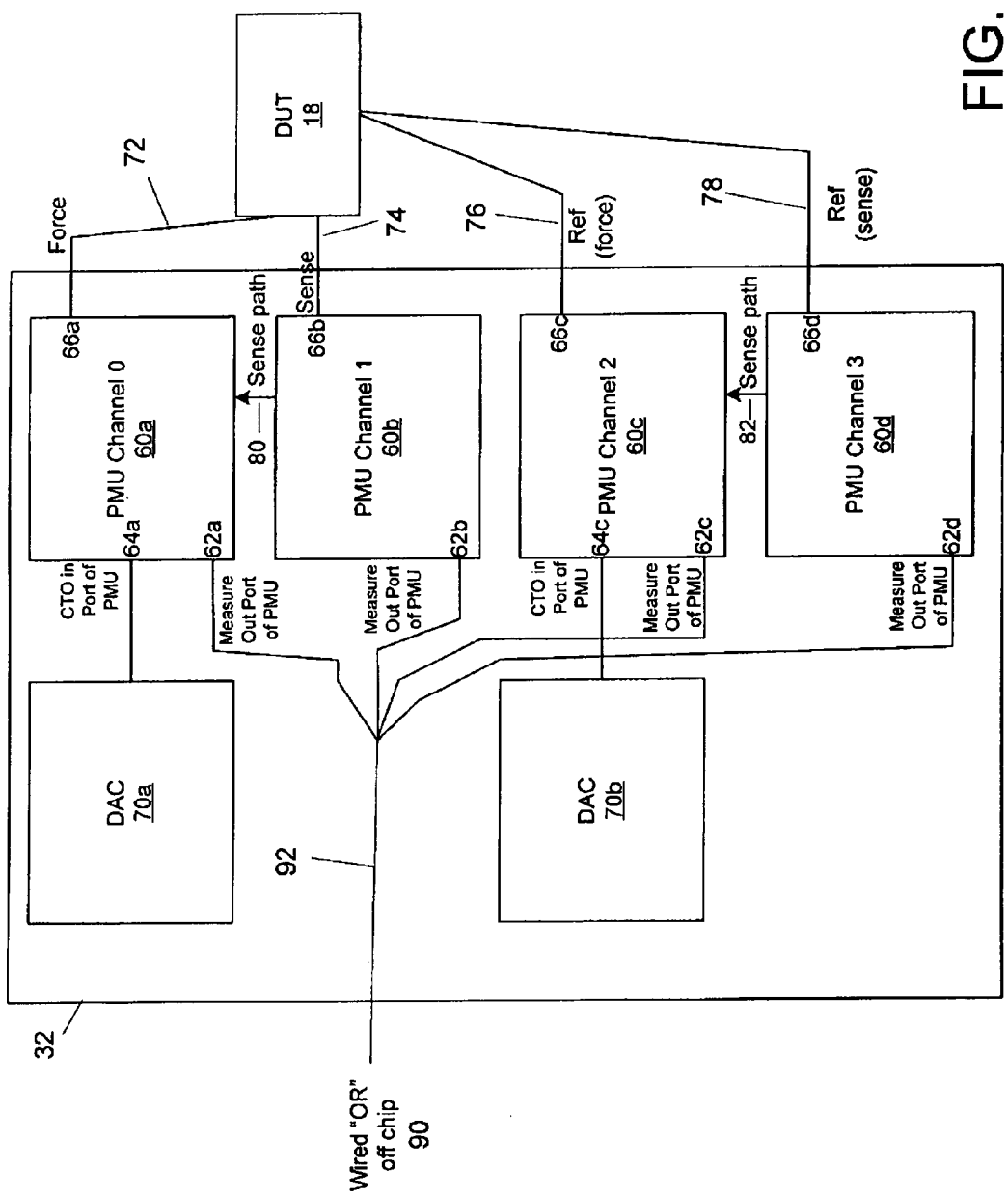
FIG. 3 is a diagrammatic view of a parametric measurement unit (PMU) stage with digital-to-analog converters (DACs).

FIG. 3 is a block diagram of PMU stage 32 for testing a DUT 18, and in particular digital-to-analog converters (DAC) or analog-to-digital converters (ADC). As shown in FIG. 3, PMU stage 32 includes PMU channels 60 (e.g., PMU channel 60*a*, PMU channel 60*b*, PMU channel 60*c*, and PMU channel 60*d*) and digital-to-analog (DAC) converters 70 (e.g., DAC 70*a* and DAC 70*b*) for testing DUT 18. Each PMU includes a measure output port 62 (e.g., PMU channel 60*a* has output port 62*a*, PMU channel 60*b* has output port 62*b*, PMU channel 60*c* has output port 62*c*, and PMU channel 60*d* has output port 62*d*) tied to a wired "OR" logic circuit 90 off of chip 30 through a measurement path 92.

DAC 70*a* is connected to an input port 62*a* of PMU channel 60*a* and controls PMU channel 60 to generate a "force" signal to the DUT 18. DAC 70*b* is connected to an input port 62*c* of PMU channel 60*c* and controls PMU 60*c* to generate a reference "force" signal to the DUT 18.

DAC 70*a* supplies an accurate voltage for force voltage mode of the PMU, which is supplied to the input of the PMU. The highest accuracy is required for PMU channel 60*a*, which is used to force the voltage as supplied by DAC 70*a*. DAC 70*b* supplies the reference voltage for the ADC being measured. Since errors due to the reference voltage can be calibrated, it is required to be stable with temperature and supply voltage changes, but need not be very accurate.

PMU channel 60*a* includes a port 66*a* to send a "force" signal to DUT 18 through "force" line 72. PMU channel 60*b* includes a port 66*b* to receive a "sense" signal from DUT 38 through "sense" line 74 based on the "force" signal and provides the "sense" signal through a sensing path 80 to PMU channel 60*a*. PMU channel 60*c* has a port 66*c* to send a reference "force" signal to DUT 18 through reference "force" line 76. PMU channel 60*d* includes a port 66*d* to receive a reference "sense" signal from DUT 38 through a reference "sense" line 78 based on the reference "force" signal and provides the reference "sense" signal through a sensing path 82 to PMU channel 60*c*.

To test a DUT 18 that is an ADC, the DACs 70*a* and 70*b* have a DC level of accuracy of less than 1 millivolt (mV). In addition, the "force" line 72, "sense" line 74, sense path 80, reference "force" line 76, reference force line 78 and sense path 82 have a DC level of accuracy of less than 1 mV.

To test a DUT 18 that is a DAC, the PMU measurement path 92 from output ports 62*b* and 62*d* have a DC level of accuracy below 1 mV. The measurement path 92 will go through the wire "OR" logic ports 90 measured off chip 30. In other embodiments, the PMU measurement path 92 may include measurement circuitry on chip 30. In addition, the "sense" line 74 and the "sense" line 78 have a DC level of accuracy below 1 mV.

The tester described herein is not limited to use with the hardware and software described above. The tester can be implemented in digital electronic circuitry, or in computer hardware, firmware, software, or in combinations thereof.

The tester can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the ATE can be performed by one or more programmable processors executing one or more computer programs to perform the functions of the ATE. All or part of the ATE can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry is not limited to the specific examples described herein. For example, while this disclosure describes circuitry within automatic test equipment, the circuitry described herein may be used in any circuit environment requiring converter testing.

Elements of different embodiments described herein may be combined to form other embodiments not specifically set forth above. Other embodiments not specifically described herein are also within the scope of the following claims.

What is claimed is:

1. An integrated circuit (IC) for use in testing an analog-to digital converter, comprising:
   a first channel of a parametric measurement unit (PMU) configured to send a force signal; and
   a first digital-to-analog converter (DAC) connected to the first channel of the PMU, the DAC having a DC level of accuracy of less than 1 millivolt a second channel of the PMU receiving a sense signal and providing a first sensing path to the first channel of the PMU.

2. The IC of claim 1, further comprising:
   a third channel of PMU configured to send a reference force signal to a device-under-test (DUT); and
   a second digital-to-analog converter (DAC) connected to the third channel of the PMU.

3. The IC of claim 2, further comprising:
   a fourth channel of the PMU receiving a reference sense signal from the DUT and providing a second sensing path to the third channel of the PMU.

4. The IC of claim 1, further comprising:
   a force line connected to the first channel of the PMU supplying the force signal and having a DC level of accuracy of less than 1 mV.

5. An integrated circuit (IC) for use in testing a digital-to-analog-converter-device-under-test (DACDUT), comprising:
   a first channel of a parametric measurement unit (PMU) configured to send a force signal and including an output port for taking measurements;
   a first digital-to-analog converter (DAC) connected to the first channel of the PMU; and
   a PMU measurement path connected to the output port having a DC level of accuracy of less than 1 mV a second channel of the PMU receiving a sense signal f through a sense line and providing a first sensing path to the first channel of the PMU.

6. The IC of claim 5, further comprising:
   a third channel of PMU configured to send a reference force signal to a device-under-test (DUT); and
   a second DAC connected to the third channel of the PMU.

7. The IC of claim 6, further comprising:
   a fourth channel of the PMU receiving a reference sense signal and providing a second sensing path to the third channel of the PMU.

8. The IC of claim 5 wherein the sense line has a DC level of accuracy of less than 1 mV.

* * * * *